United States Patent
Hsieh et al.

(10) Patent No.: US 10,665,457 B2
(45) Date of Patent: May 26, 2020

(54) METHOD OF FORMING AN INTEGRATED CIRCUIT USING A PATTERNED MASK LAYER

(71) Applicant: Taiwan Semiconductor Manufacturing Company, Ltd., Hsinchu (TW)

(72) Inventors: Tzu-Yen Hsieh, Taipei (TW); Ming-Ching Chang, Hsinchu (TW); Chun-Hung Lee, Zhudong Town (TW); Yih-Ann Lin, Jhudong Township (TW); De-Fang Chen, Lujhu Township (TW); Chao-Cheng Chen, Shin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/940,430

(22) Filed: Mar. 29, 2018

(65) Prior Publication Data
US 2018/0218904 A1    Aug. 2, 2018

Related U.S. Application Data

(63) Continuation of application No. 15/583,315, filed on May 1, 2017, now Pat. No. 9,934,971, which is a (Continued)

(51) Int. Cl.
*H01L 21/033* (2006.01)
*H01L 21/311* (2006.01)
(Continued)

(52) U.S. Cl.
CPC ...... *H01L 21/0338* (2013.01); *H01L 21/0276* (2013.01); *H01L 21/0335* (2013.01);
(Continued)

(58) Field of Classification Search
CPC .................................................. H01L 21/0337
(Continued)

(56) References Cited

U.S. PATENT DOCUMENTS 5,336,630 A    8/1994 Yun et al.
5,358,908 A   10/1994 Reinberg et al.
(Continued)

FOREIGN PATENT DOCUMENTS

CN    101567372    10/2009

OTHER PUBLICATIONS

Masahara et al., "Ultrathin Channel Vertical DG MOSFET Fabricated by Using Ion-Bombardment-Retarded Etching", IEEE Transactions on Electron Devices, vol. 51, No. 12, pp. 2078-2085. Dec. 2004.

*Primary Examiner* — Lex H Malsawma
*Assistant Examiner* — Eric W Jones
(74) *Attorney, Agent, or Firm* — Haynes and Boone, LLP

(57) ABSTRACT

A method of forming an integrated circuit includes forming a patterned mask layer on a material layer, wherein the patterned mask layer has a plurality of first features, and a first distance between adjacent first features of the plurality of first features. The method further includes patterning the material layer to form the first features in the material layer. The method further includes increasing the first distance between adjacent first features of the plurality of first features to a second distance. The method further includes treating portions of the material layer exposed by the patterned mask layer. The method further includes removing the patterned mask layer; and removing non-treated portions of the material layer.

20 Claims, 4 Drawing Sheets

Related U.S. Application Data continuation of application No. 14/711,842, filed on May 14, 2015, now Pat. No. 9,640,398, which is a continuation of application No. 14/304,022, filed on Jun. 13, 2014, now Pat. No. 9,059,085, which is a continuation of application No. 13/277,552, filed on Oct. 20, 2011, now Pat. No. 8,772,183.

(51) Int. Cl.

| | | |
|---|---|---|
| *H01L 21/3213* | (2006.01) | |
| *H01L 21/3215* | (2006.01) | |
| *H01L 21/265* | (2006.01) | |
| *H01L 21/027* | (2006.01) | |
| *H01L 21/266* | (2006.01) | |

(52) U.S. Cl.
CPC ........ *H01L 21/0337* (2013.01); *H01L 21/266* (2013.01); *H01L 21/26506* (2013.01); *H01L 21/311* (2013.01); *H01L 21/31144* (2013.01); *H01L 21/32134* (2013.01); *H01L 21/32139* (2013.01); *H01L 21/32155* (2013.01)

(58) Field of Classification Search
USPC .................................................. 438/510, 717
See application file for complete search history.

(56) References Cited

U.S. PATENT DOCUMENTS

| | | | |
|---|---|---|---|
| 5,393,373 A | 2/1995 | Jun et al. | |
| 5,667,940 A | 9/1997 | Hsue et al. | |
| 6,110,837 A | 8/2000 | Linliu et al. | |
| 6,124,212 A | 9/2000 | Fan et al. | |
| 6,261,964 B1 | 7/2001 | Wu et al. | |
| 6,309,975 B1 | 10/2001 | Wu et al. | |
| 6,350,390 B1* | 2/2002 | Liu | G05D 5/03 |
| | | | 216/59 |
| 6,451,701 B1 | 9/2002 | Wang et al. | |
| 6,461,967 B2 | 10/2002 | Wu et al. | |
| 6,573,189 B1* | 6/2003 | Lin | H01L 21/0276 |
| | | | 257/E21.029 |
| 6,596,648 B2 | 7/2003 | Wu et al. | |
| 6,599,840 B2 | 7/2003 | Wu | |
| 6,620,631 B1* | 9/2003 | Tao | H01J 37/32935 |
| | | | 216/60 |
| 6,630,408 B1* | 10/2003 | Tzu | G03F 1/32 |
| | | | 430/5 |
| 6,667,237 B1 | 12/2003 | Metzler | |
| 6,730,608 B2* | 5/2004 | Lin | G03F 7/70425 |
| | | | 257/E21.027 |
| 6,734,107 B2 | 5/2004 | Lai et al. | |
| 6,897,517 B2 | 5/2005 | Van Houdt et al. | |
| 7,081,413 B2* | 7/2006 | Chan | H01L 21/28123 |
| | | | 257/E21.206 |
| 7,183,205 B2 | 2/2007 | Hong | |
| 7,253,113 B2 | 8/2007 | Cheng | |
| 7,390,753 B2* | 6/2008 | Lin | G03F 7/40 |
| | | | 216/47 |
| 7,429,536 B2 | 9/2008 | Abatchev et al. | |
| 7,550,391 B2 | 6/2009 | Jeon et al. | |
| 7,811,940 B2 | 10/2010 | Sandhu | |
| 7,939,451 B2 | 5/2011 | Tsai et al. | |
| 8,153,350 B2 | 4/2012 | Chang et al. | |
| 8,334,211 B2 | 12/2012 | Kewley | |
| 8,486,287 B2 | 7/2013 | Zhu et al. | |
| 8,772,183 B2* | 7/2014 | Hsieh | H01L 21/0337 |
| | | | 438/798 |
| 9,059,085 B2 | 6/2015 | Hsieh et al. | |
| 9,640,398 B2* | 5/2017 | Hsieh | H01L 21/0337 |
| 9,934,971 B2* | 4/2018 | Hsieh | H01L 21/0337 |
| 2002/0001960 A1 | 1/2002 | Wu et al. | |
| 2002/0182816 A1 | 12/2002 | Wu et al. | |
| 2002/0182872 A1 | 12/2002 | Wu et al. | |
| 2002/0187648 A1 | 12/2002 | Wu et al. | |
| 2003/0091936 A1 | 5/2003 | Rottstegge et al. | |
| 2004/0026368 A1 | 2/2004 | Barnes et al. | |
| 2005/0059231 A1 | 3/2005 | Nakagawa et al. | |
| 2005/0148189 A1 | 7/2005 | Sung | |
| 2005/0272259 A1 | 12/2005 | Hong | |
| 2007/0026629 A1* | 2/2007 | Chen | H01L 21/82341 |
| | | | 438/424 |
| 2007/0049052 A1* | 3/2007 | Baier | H01L 21/0337 |
| | | | 438/780 |
| 2007/0190711 A1 | 8/2007 | Luo et al. | |
| 2007/0249170 A1 | 10/2007 | Kewley | |
| 2008/0090418 A1 | 4/2008 | Jeon et al. | |
| 2008/0260941 A1 | 10/2008 | Jin | |
| 2008/0305635 A1 | 12/2008 | Tsai et al. | |
| 2009/0233448 A1* | 9/2009 | Cho | H01L 21/0337 |
| | | | 438/705 |
| 2010/0068656 A1 | 3/2010 | Yeh et al. | |
| 2011/0059407 A1 | 3/2011 | Lin et al. | |
| 2011/0183269 A1 | 7/2011 | Zhu | |
| 2015/0243504 A1 | 8/2015 | Hsieh et al. | |
| 2017/0236712 A1 | 8/2017 | Hsieh et al. | |

\* cited by examiner

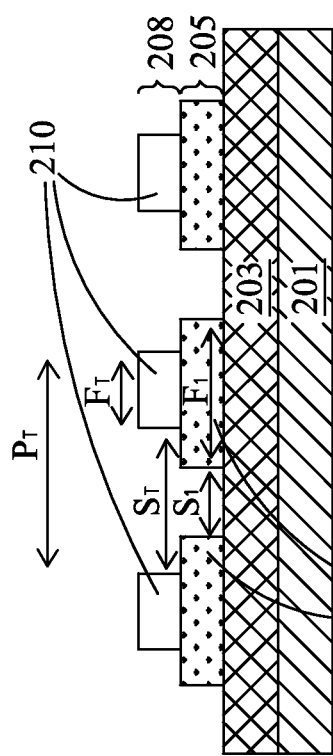
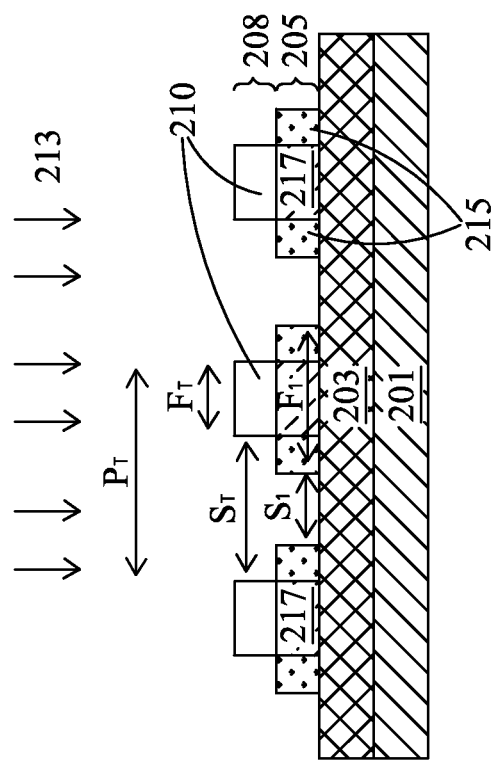

METHOD OF FORMING AN INTEGRATED CIRCUIT USING A PATTERNED MASK LAYER

PRIORITY CLAIM

The present application is a continuation of U.S. application Ser. No. 15/583,315, filed May 1, 2017, which is a continuation of U.S. application Ser. No. 14/711,842, filed May 14, 2015, now U.S. Pat. No. 9,640,398, which is a continuation of U.S. application Ser. No. 14/304,022, filed Jun. 13, 2014, now U.S. Pat. No. 9,059,085, which is a continuation of U.S. application Ser. No. 13/277,552, filed Oct. 20, 2011, now U.S. Pat. No. 8,772,183, issued Jul. 8, 2014, the disclosures of which are incorporated by reference herein in their entireties.

TECHNICAL FIELD

The disclosure relates generally to integrated circuit fabrication methods and, more particularly, to a method of fabricating an integrated circuit with a reduced pitch.

BACKGROUND

Integrated circuits are commonly used to make a wide variety of electronic devices, such as memory chips. One aim in production is to reduce the size of integrated circuits, so as to increase the density of the individual components and consequently enhance the functionality of an integrated circuit. The minimum pitch on an integrated circuit (the minimum distance between the same points of two adjacent structures of the same type, e.g., two adjacent gate conductors) is often used as a representative measure of the circuit's density. The feature width is sometimes referred to herein as F, and the width of the space between features is sometimes referred to herein as S.

Increases in circuit density often are limited by the resolution of the available photolithographic equipment. The minimum size of features and spaces that a given piece of photolithographic equipment can produce is related to its resolution capability. If one tries to define features in a photoresist which are smaller than the machine's minimum feature size, then the photoresist regions exposed to radiation may fail to correspond to the mask plate pattern, resulting in the photoresist features not being accurately reproduced.

Some attempts have been made to try to reduce the pitch of an integrated circuit device below that of the minimum pitch produced lithographically, but these methods are difficult to control and show varying results.

In view of the drawbacks of the prior methods, it is necessary to provide a method that can reduce the pitch in a device below that producible by the lithographic process.

BRIEF DESCRIPTION OF THE DRAWINGS

Exemplary embodiments will be described with reference to the accompanying figures. It should be understood that the drawings are for illustrative purposes and are therefore not drawn to scale.

FIGS. 2 to 7 are cross-sectional views showing various stages during fabrication of a structure according to the method in FIG. 1.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

It will be understood that when an element such as a layer, region or substrate is referred to as being "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As used herein, a particular patterned layer is "used as a mask" for a particular process step if it is the top layer present when the particular process step is performed, or if it is only an intermediate layer present when the particular process step is performed, as long as any superposing layers are patterned the same as or more narrowly than the particular layer. In other words, as used herein, if the structure includes two patterned layers, then each of them individually, as well as both of them together, are all considered herein to act as a "mask" for the particular process step. The presence of a superposing layer having the same or narrower pattern as the particular layer does not prevent the particular layer from being "used as a mask" for the particular process step.

The term "substrate" as described herein, refers to a semiconductor substrate on which various layers and integrated circuit components are formed. The substrate may comprise silicon or a compound semiconductor, such as GaAs, InP, Si/Ge, or SiC. Examples of layers may include dielectric layers, doped layers, metal layers, polysilicon layers and via plugs that may connect one layer to one or more layers. Examples of integrated circuit components may include transistors, resistors, and/or capacitors. The substrate may be part of a wafer that includes a plurality of semiconductor dies fabricated on the surface of the substrate, wherein each die comprises one or more integrated circuits. The semiconductor dies are divided by scribe lines (not shown) between adjacent dies. The following process steps will be performed on each of the semiconductor dies on the surface of the substrate.

Figure 1:
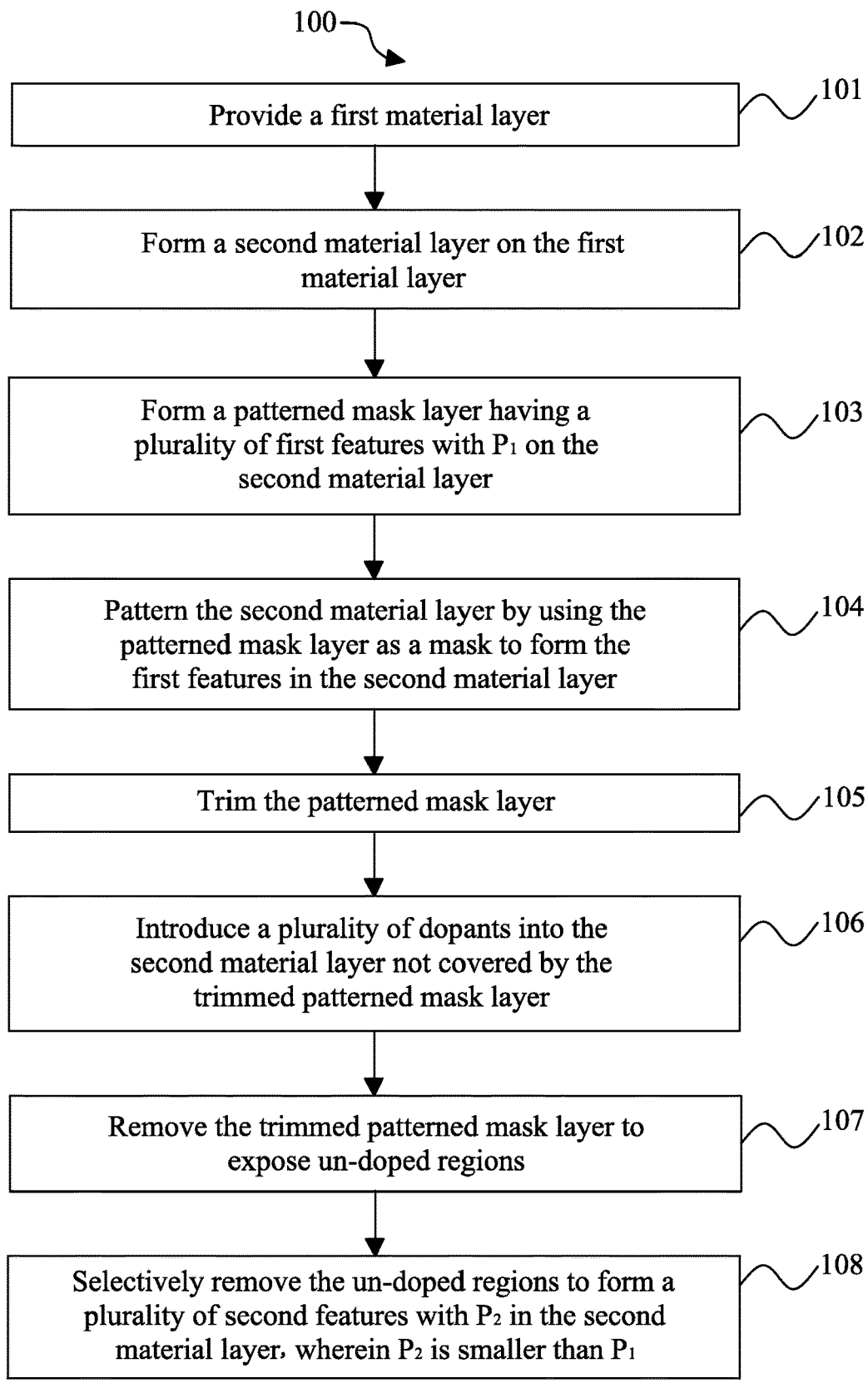
FIG. 1 is a flow chart of a method of forming a structure of an integrated circuit according to one or more embodiments of this disclosure.

FIG. 1 is a flow chart of a method 100 of forming a structure of an integrated circuit according to various embodiments of this disclosure. The method 100 begins at operation 101 where a first material layer is provided. At operation 102, a second material layer is formed on the first material layer. At operation 103, a patterned mask layer is formed on the second material layer. The patterned mask layer has a plurality of first features with a first pitch $P_1$. At operation 104, the second material layer is patterned by using the patterned mask layer as a mask. The first features are formed in the second material layer and a portion of a top surface of the first material layer is exposed. At operation 105, the patterned mask layer is trimmed after patterning the second material layer. A trimmed patterned mask layer is formed. At operation 106, a plurality of dopants is introduced into the second material layer not covered by the trimmed patterned mask layer. Various doped regions with a second pitch $P_2$ are formed in the second material layer. The second pitch $P_2$ is smaller than the first pitch $P_1$. At operation 107, the trimmed patterned mask layer is removed to expose various un-doped regions in the second material layer. At operation 108, the un-doped regions are selectively removed to form a plurality of second features in the second material layer. The plurality of second features corresponds to the respective doped regions in the second material layer. The plurality of second features has the second pitch $P_2$.

Referring to the drawings, FIGS. 2 to 7 depict cross-sectional views showing various stages during fabrication of a structure according to the method in FIG. 1.

Figure 2:
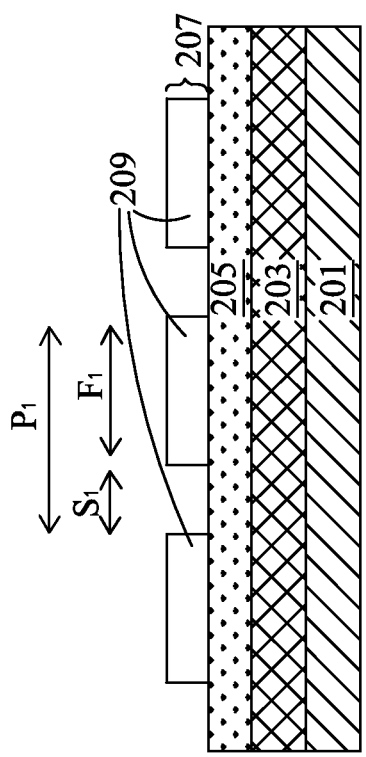

Referring to FIG. 2, a first material layer 203, a second material layer 205 and a patterned mask layer 207 are sequentially formed over the substrate 201. The layers 203, 205 and 207 are patterned, as will be further discussed below, to form one or more features over the substrate 201. It is understood that any desired feature may be patterned in the material layers, such as lines, gate structures and shallow trench isolations (STIs), etc.

The first material layer 203 may include a dielectric layer (also referred to as dielectric layer 203) or a metal layer (also referred to as metal layer 203) formed over the substrate 201 by any suitable process, such as chemical vapor deposition (CVD) and physical vapor deposition (CVD). The dielectric layer 203 may comprise silicon oxide, silicon oxynitride, silicon nitride, a high-k dielectric layer comprising hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), transition metal-oxides, transition metal-nitrides, transition metal-silicates, metal aluminates, zirconium silicate, zirconium aluminate, zirconium oxide, titanium oxide, aluminum oxide, hafnium dioxide-alumina ($HfO_2$—$Al_2O_3$) alloy, and/or combinations thereof. The metal layer 203 may comprise aluminum, copper, titanium, tantulum, tantalum nitride, nickel silicide, cobalt silicide, TaC, TaSiN, metal alloys, and/or combinations thereof.

The second material layer 205 is formed over the first material layer 203 by any suitable process, such as chemical vapor deposition (CVD). In one example, the second material layer 205 comprises a silicon layer including a polysilicon layer, a single crystalline silicon layer or an amorphous silicon layer. The second material layer 205 that may be used as a mask layer for the underlying first material layer 203 for the following etching process. In other words, the second material layer 205 has a higher etch resistance than the first material layer 203 during the first material layer 203 etching process. The second material layer 205 is formed to any suitable thickness. For example, the second material layer 205 has a thickness of in a range approximately 300 to 2000 Å.

Next, the patterned mask layer 207 is formed over the second material layer 205. In one embodiment, the patterned mask layer 207 comprises a photo resist layer (also referred to as photo resist layer 207). The processes may include photoresist coating (e.g., spin-on coating), soft baking, mask aligning, exposure, post-exposure baking, developing the photoresist, rinsing, drying (e.g., hard baking), and/or combinations thereof. The patterned mask layer 207 has a plurality of first features 209 with a first pitch $P_1$ formed over the second material layer 205. The first pitch $P_1$ is the minimum distance between the same points of two adjacent first features 209. The first pitch $P_1$ equals a width Fl of the first feature 209 plus a first space S1 between adjacent the first features 209.

In another embodiment, various imaging enhancement layers are formed under photo resist layer 207 to enhance the pattern transfer of the first features 209 to the underlying layers. The imaging enhancement layer may comprise a tri-layer including a bottom organic layer, a middle inorganic layer and a top organic layer. The imaging enhancement layer may also include an anti-reflective coating (ARC) material, a polymer layer, an oxide derived from TEOS (tetraethylorthosilicate), silicon oxide, or a Si-containing anti-reflective coating (ARC) material, such as a 42% Si-containing ARC layer.

In yet another embodiment, the patterned mask layer 207 comprises a hard mask layer. The hard mask layer comprises an oxide material, silicon nitride, silicon oxynitride, an amorphous carbon material, silicon carbide or tetraethylorthosilicate (TEOS). The patterned hard mask layer is formed by defining the first features 209 in an overlying patterned photo resist layer. The patterned photo resist layer is used as a mask for etching the underlying hard mask layer. After etching, the first features 209 are formed in the patterned hard mask layer and the patterned photo resist layer is removed.

Figure 3:
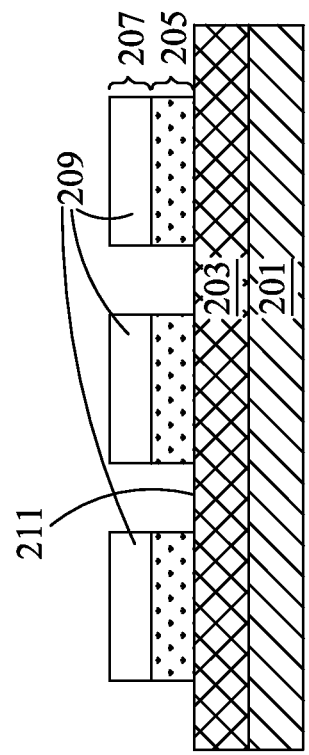

Referring to FIG. 3, the second material layer 205 is patterned by using the patterned mask layer 207 as a mask. The first features 209 in the patterned mask layer 207 are transferred to the second material layer 205 by etching the second material layer 205. In this embodiment, a polysilicon layer is used as the second material layer 205. The polysilicon layer is etched with a plasma process in a $Cl_2$/HBr/$O_2$ ambient environment. A portion of a top surface 211 of the first material layer 203 is exposed after the polysilicon layer etching process. During the second material layer 205 etching process, the first material layer 203 has a higher etch resistance than the second material layer 205. Less of the first material layer 203 is consumed compared to the second material layer 205 in this etching process. Most of the first material layer 203 remains.

Referring to FIG. 4, the patterned mask layer 207 is trimmed to form a trimmed patterned mask layer 208. In this embodiment, a patterned photo resist layer is used as the patterned mask layer 207. The photo resist layer is etched with a plasma process in a HBr/$O_2$ ambient environment to form the trimmed patterned mask layer 208. The trimmed patterned mask layer 208 has a plurality of features 210 with a pitch $P_T$ formed over the first features 209 of the second material layer 205. The first space $S_1$ between adjacent the first features 209 in the patterned mask layer 207 is widened to a space $S_T$ between adjacent features 210 in the trimmed patterned mask layer 208. A width $F_T$ of the features 210 is less than the width $F_1$ of the first features 209.

Referring to FIG. 5, a plurality of dopants 213 is introduced into the second material layer 205 not covered by the trimmed patterned mask layer 208 to form doped regions 215 in the second material layer 205. Namely, the features 210 in the trimmed patterned mask layer 208 are used as a mask to form un-doped regions 217. The width $F_T$ of the features 210 substantially equals a space $s_2$ between adjacent doped regions 215. A width $F_2$ of each doped region 215 substantially equals the difference between the width $F_1$ and the width $F_T$ divided by two. The sum of the width $F_2$ and the space $s_2$ (or the width $F_T$) equals a second pitch $P_2$ for doped regions 215. Since the width $F_T$ is less than the width $F_1$, the second pitch $P_2$ is smaller than the first pitch $P_1$.

In one example, the second material layer 205 is a polysilicon layer. The plurality of dopants 213 is substantially vertically implanted into the polysilicon layer. The dopants may include As, P, B, C, N, Si, Ge or $BF_2$. A dosage of the dopants is substantially higher than 1E15 ion/cm². The ion implantation creates different etching removal rates for the un-doped regions 217 and the doped region 215 in following removal process. The un-doped regions 217 may be selectively removed. Advantageously, since various dopants 213 are substantially vertically implanted, the second features 210 are accurately transferred from the trimmed patterned mask layer 208 into un-doped regions 217 in the second material layer 205. Edges of the un-doped regions 217 (also edges of doped regions 215) are vertically aligned with the corresponding sidewalls of the second features 210 in the trimmed patterned mask layer 208.

Figure 6:
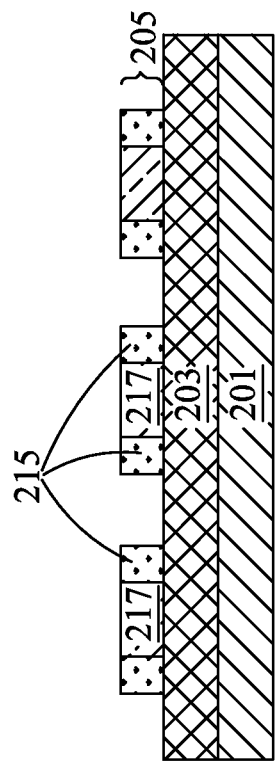

Referring to FIG. 6, the trimmed mask layer 208 is removed to expose un-doped regions 217 in the second material layer 205. In one example, the trimmed mask layer 208 is a photo resist layer. The photo resist layer may be ashed in an oxygen ambient environment.

Figure 7:
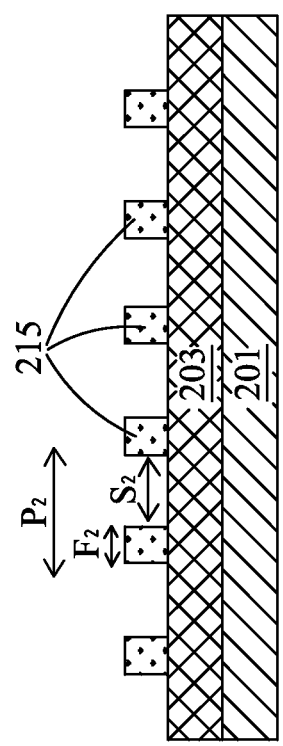

Referring to FIG. 7, the un-doped regions 217 are selectively removed to form a plurality of second features in the second material layer 205. The second features are corresponding to the respective doped regions 215. The un-doped region 217 has a higher etching removal rates than the doped regions 215 has in the removal process. In one embodiment, the second material layer 205 is a silicon layer. The un-doped regions 217 may be selectively removed in an etchant including tetramethyl ammonium hydroxide (TMAH), tetrabutylphosphonium hydroxide, tetraphenylarsonium hydroxide, KOH, NaOH or NH$_4$OH. When the etchant is TMAH, the etchant solution is in a range of about 1 to about 10 weight percent of TMAH in de-ionized water to create a shaped image of the second features in the second material layer 205. In another embodiment, the un-doped regions 217 may be removed by a dry etching process. The dry etching process has a higher etching removal rates for un-doped region 217 than doped region 215. After the un-doped region 217 removal process, the pattern of the doped regions 215 is transferred to the second features in the second material layer 205. A width, a space and a pitch of the second features substantially equal to the width $F_2$, the space $s_2$ and the pitch $P_2$ of the doped regions 215, respectively. The second features with a narrow pitch are fabricated.

In other embodiments, the first material layer 203 is etched by using the plurality of the second features in the second material layer 205 as a mask for fabricating the narrow pitch pattern in the first material layer 203.

Note that in all of the above embodiments, the feature narrowing process described herein can be repeated if desired, assuming appropriate materials are used in the starting structure of FIG. 2, and substrate 201 include appropriate sub-layers superimposing the bulk support material. The repeated feature narrowing process can be thought of as being constructed by adding a second instance of the process steps described above either before or after the first instance described above.

In the above embodiments, the doped regions 215 are formed at edge portions of the first features 209 in the second material layer 205 by means of processes which introduce a plurality of dopants into the second material layer 205. These processes can be implantation or thermal diffusion processes, as in the above-described embodiments, or can be another form of chemical reaction or inter-diffusion reaction in other embodiments. Any process that creates different etching removal rates for un-doped region 217 and doped region 215 will suffice, so long as the impact of the process on other materials in the structure is insignificant or otherwise accommodated.

In addition, it will be appreciated that the process of trimming the patterned mask layer 207 has the effect of reducing the width of the features in the second material layer 205. The following dopant introducing process replaces the volume of the second material layer 205 with a volume of doped regions 215 at edge portions of the first features 209. The final second feature has a width $F_2$ that is less than the starting width $F_1$ of the first feature 209.

In one embodiment, the first features 209 are formed in a regular repeated pattern of the width $F_1$ and one-third of the width $F_1$ for the space $S_1$, and the process can be used to form a new regular repeated pattern of doped regions 215 (also the second features). The doped region 215 has equal width $F_2$ and space $s_2$. The width $F_2$ is also substantially one-third of the width $F_1$. The space $s_2$ is also substantially the space $S_1$. Hence, the second pitch $P_2$ is substantially one-half of the first pitch $P_1$. This can be accomplished by using a trimming process in which $F_T=\frac{1}{3} F_1=\frac{1}{3} S_T$.

In another embodiment, the first features 209 are formed in a regular repeated pattern of the width $F_1$ and one-half of the width $F_1$ for the space $S_1$, and the process can be used to form a new regular repeated pattern of doped regions 215 (also the second features). The width $F_2$ substantially equals one-quarter of the width $F_1$. The space $S_2$ substantially equals the space $S_1$. Hence, the second pitch $P_2$ is substantially one-half of the first pitch $P_1$. This can be accomplished by using a trimming process in which $F_T=\frac{1}{2} F_1=\frac{1}{2} S_T$.

In other embodiments, $F_T$ can be greater or less than $\frac{1}{3} F_1$, and/or $F_T$ can be greater or less than $\frac{1}{3} S_T$, and/or the original patterned mask layer 207 may not be formed in regular pattern of equal width and space. Variations such as these and others can be used to produce various different sub-lithographic features patterns as desired in the resulting integrated structure.

Various embodiments of the present invention may be used to improve the method of fabricating an integrated circuit with a reduced pitch. For example, during the processes for pitch reduction, only one lithograph process is needed to define the starting features in the patterned mask layer. There is no overlay issue that comes from the features formed by another lithograph process. In other pitch reduction methods, the patterned mask layer may be composed of two similar initial features. Each feature has it own film stack. When the patterned mask layer is used as a mask to perform an etching process on a specific layer, the resulting features in the specific layer will generate two groups due to the influence from the film stack of the initial features. The resulting features have different dimensions in the completed products. The device performance and yield are thus hard to control. The processes in this disclosure are performed in a way of pattern transference in the same stacking film. The resulting features have the identical dimension. The device performance and yield of the completed products are easily controlled. The disclosed embodiments increase the flexibility to allocate different products for the production line.

One aspect of this description relates to a method of forming an integrated circuit. The method includes forming a patterned mask layer on a material layer, wherein the patterned mask layer has a plurality of first features, and a first distance between adjacent first features of the plurality of first features. The method further includes patterning the material layer to form the first features in the material layer. The method further includes increasing the first distance between adjacent first features of the plurality of first features to a second distance. The method further includes treating portions of the material layer exposed by the patterned mask layer. The method further includes removing the patterned mask layer; and removing non-treated portions of the material layer.

Another aspect of this description relates to a method of forming an integrated circuit. The method includes forming a patterned mask layer on a first material layer, the patterned mask layer having a plurality of first features with a first pitch, wherein the material layer is over a second material layer. The method further includes transferring the plurality of first features to the first material layer; and increasing the first pitch in the patterned mask layer to a second pitch. The method further includes treating portions of the first material layer exposed by the patterned mask layer. The method further includes removing the patterned mask layer; and removing non-treated portions of the first material layer to form a plurality of second features having a third pitch.

Still another aspect of this description relates to a method of forming an integrated circuit. The method includes forming a patterned mask layer on a silicon-containing layer, the patterned mask layer having a plurality of first features with a first pitch. The method further includes patterning the silicon-containing layer using the patterned mask layer; and trimming the patterned mask layer to form a trimmed patterned mask layer. The method further includes implanting dopants into the silicon-containing layer exposed by the trimmed patterned mask layer. The method further includes removing the trimmed patterned mask layer; and removing un-doped portions of the silicon-containing layer to form a plurality of second features having a second pitch.

Although the embodiments and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. Accordingly, the appended claims are intended to include within their scope such processes, machines, manufacture, compositions of matter, means, methods, or steps that perform substantially the same function or achieve substantially the same result as the corresponding embodiments described herein.

What is claimed is:

1. A method comprising:
   forming a conductive layer over a substrate;
   forming a first feature and a second feature over a material layer, the material layer including polysilicon;
   patterning the material layer using the first and second features as a mask;
   treating portions of the material layer exposed by the first and second features;
   removing the first and second features; and
   removing non-treated portions of the material layer, and
   wherein the removing of the non-treated portions of the material layer exposes a portion of the conductive layer.

2. The method of claim 1, further comprising removing a portion of the first feature and a portion of the second feature to expose portions of the material layer, and
   wherein treating portions of the material layer exposed by the first and second features includes treating the exposed portions of the material layer.

3. The method of claim 2, wherein the removing of the portion of the first feature and the portion of the second feature includes performing a plasma process.

4. The method of claim 1, wherein the treating of the portions of the material layer exposed by the first and second features includes forming doped features in the portions of the material exposed by the first and second features.

5. The method of claim 1, wherein the removing of the first and second features occurs prior to the removing of the non-treated portions of the material layer.

6. The method of claim 1, wherein the treating portions of the material layer exposed by the first and second features includes implanting a dopant into the portions of the material exposed by the first and second features, and
   wherein the dopant is selected from the group consisting of As, P, B, C, N, Si, and Ge.

7. A method comprising:
   forming a first feature and a second feature directly on a first material layer such that the first feature and the second feature physically contact the first material layer, wherein the first feature is formed of the same material throughout the first feature and the second feature is formed of the same material throughout the second feature;
   patterning the first material layer by using the first and second features as a mask while a top surface of the first feature is exposed, the first feature having a first sidewall surface and opposing second sidewall surface and the top surface extending from the first sidewall surface to the second sidewall surface;
   implanting a dopant into a first portion of the patterned first material layer while a second portion of the patterned first material layer is covered by the first feature, wherein after the implanting of the dopant, the second portion of the patterned first material layer is free of the dopant;
   removing the first and second features; and
   removing the second portion of the patterned first material layer to form a third feature.

8. The method of claim 7, wherein the first material layer includes a polysilicon material.

9. The method of claim 7, further comprising removing a portion of the first feature to expose the first portion of the patterned first material layer after patterning the first material layer.

10. The method of claim 9, wherein the removing of the portion of the first feature to expose the first portion of the patterned first material layer occurs prior to the implanting of the dopant into the first portion of the patterned first material layer.

11. The method of claim 7, wherein the dopant is selected from the group consisting of As, P, B, C, N, Si, Ge and $BF_2$.

12. The method of claim 7, further comprising:
    forming a second material layer over a substrate, the second material layer including a metal material;
    forming the first material layer over the second material layer, the first material layer including silicon; and
    wherein the patterning of the first material layer by using the first and second features as the mask includes removing portions of the first material to thereby expose portions of the second material layer.

13. The method of claim 7, further comprising:
    forming a second material layer over a substrate, the second material layer including a dielectric material;
    forming the first material layer over the second material layer, the first material layer including silicon; and
    wherein the patterning of the first material layer by using the first and second features as the mask includes removing portions of the first material to thereby expose portions of the second material layer.

14. The method of claim 7, further comprising forming a conductive layer over a substrate, and
   wherein the removing of the second portion of the patterned first material layer exposes a portion of the conductive layer.

15. A method comprising:
   forming a first feature on a silicon-containing material layer, wherein the silicon-containing material layer is disposed over a metal-containing material layer;
   patterning the silicon-containing material layer by using the first feature as a mask, wherein the patterning of the silicon-containing material layer by using the first feature as the mask includes removing some of the silicon-containing material layer to thereby expose at least a portion of the metal-containing material layer;
   patterning the first feature to form a patterned first feature;
   implanting dopants into a first portion of the silicon-containing material layer that is exposed by the patterned first feature while a second portion of the silicon-containing material layer is covered by the patterned first feature;
   removing the patterned first feature; and
   removing the second portion of the silicon-containing material layer, wherein after the removing of the second portion of the silicon-containing material layer, the first portion of the silicon-containing material layer remains.

16. The method of claim 15, wherein after the patterning of the first feature to form the patterned first feature a top surface of the silicon-containing material layer is exposed.

17. The method of claim 15, wherein the first feature is formed of a material selected from the group consisting of an oxide material, a silicon nitride material, a silicon oxynitride material, an amorphous carbon material, a silicon carbide material and a tetraethylorthosilicate (TEOS) material.

18. The method of claim 15, wherein the removing of the patterned first feature includes performing a first removal process, and
   wherein the removing of the second portion of the silicon-containing material layer includes performing a second removal process that is different than the first removal process.

19. The method of claim 15, wherein the removing of the second portion of the silicon-containing material layer includes performing a dry etching process.

20. The method of claim 15, wherein the implanting of dopants into the first portion of the silicon-containing material layer forms a dope feature, the doped feature having an edge that is vertically aligned with a sidewall of the patterned first feature.

* * * * *